United States Patent
Sammel, Jr.

(10) Patent No.: US 10,848,160 B2
(45) Date of Patent: Nov. 24, 2020

(54) DEVICES, SYSTEMS, AND METHODS FOR REDUCING JITTER IN CONTROL SYSTEMS

(71) Applicant: Aerotech, Inc., Pittsburgh, PA (US)

(72) Inventor: David Wayne Sammel, Jr., Pittsburgh, PA (US)

(73) Assignee: Aerotech, Inc., Pittsburgh, PA (US)

( * ) Notice: Subject to any disclaimer, the term of this patent is extended or adjusted under 35 U.S.C. 154(b) by 219 days.

(21) Appl. No.: 16/031,337

(22) Filed: Jul. 10, 2018

(65) Prior Publication Data

US 2020/0021297 A1 Jan. 16, 2020

(51) Int. Cl.
| H03L 7/081 | (2006.01) |
| G01R 29/26 | (2006.01) |
| H03L 7/087 | (2006.01) |
| H03L 7/099 | (2006.01) |
| H04B 1/403 | (2015.01) |

(52) U.S. Cl.
CPC .............. *H03L 7/081* (2013.01); *G01R 29/26* (2013.01); *H03L 7/087* (2013.01); *H03L 7/0992* (2013.01); *H04B 1/403* (2013.01); *H03L 2207/06* (2013.01)

(58) Field of Classification Search
CPC ... H03L 7/00; H03L 7/08; H03L 7/087; H03L 7/0992; H03L 2207/06; H04B 1/38; H04B 1/40; H04B 1/403; H04B 7/00; H04B 7/0008; H04B 7/0025; H04B 7/033; G01R 29/26
USPC ....... 375/219, 220, 226, 259, 354, 371, 376; 370/350, 516; 713/400, 501–503
See application file for complete search history.

(56) References Cited

U.S. PATENT DOCUMENTS

| 5,229,697 | A | 7/1993 | Taylor et al. | |
| 5,566,180 | A | 10/1996 | Eidson et al. | |
| 6,088,527 | A | * 7/2000 | Rybczynski | H04N 5/222 348/E5.022 |
| 6,252,445 | B1 | 6/2001 | Eidson | |
| 6,278,710 | B1 | 8/2001 | Eidson | |
| 6,370,159 | B1 | 4/2002 | Eidson | |
| 7,366,205 | B2 | 4/2008 | Arnold et al. | |
| 7,441,048 | B2 | 10/2008 | Arnold et al. | |
| 7,590,210 | B2 | 9/2009 | Aweya et al. | |
| 7,970,090 | B1 | 6/2011 | Tetzlaff | |
| 9,292,036 | B2 | 3/2016 | Grocutt et al. | |
| 9,547,333 | B2 | 1/2017 | Breuer et al. | |

(Continued)

OTHER PUBLICATIONS

"Precision Time Protocol", Wikipedia, retrieved from https://en.wikipedia.org/wiki/Precision_Time_Protocol#Synchronization.

(Continued)

*Primary Examiner* — Young T. Tse
(74) *Attorney, Agent, or Firm* — The Webb Law Firm

(57) ABSTRACT

A system for reducing jitter in a motion control system which includes at least one drive device programmed or configured to receive data associated with a time base of a controller device in the motion control system, determine the frequency of the time base of the controller device based on the data associated with the time base of the controller device, determine a frequency adjustment to be made to a time base of the at least one drive device based on the frequency of the time base of the controller device, adjust a frequency of the time base of the at least one drive based on the frequency adjustment, and provide data associated with the time base of the at least one drive device.

20 Claims, 6 Drawing Sheets

(56) References Cited

U.S. PATENT DOCUMENTS

| | | |
|---|---|---|
| 9,584,302 B2 | 2/2017 | Karthik et al. |
| 2012/0039424 A1* | 2/2012 | Ferchland ............ H04B 1/7073 |
| | | 375/343 |
| 2015/0214961 A1 | 7/2015 | Toriumi et al. |
| 2017/0201656 A1* | 7/2017 | Zhang .................. G09G 3/3611 |
| 2018/0281195 A1* | 10/2018 | Lee .......................... B25J 19/02 |
| 2018/0348376 A1* | 12/2018 | Derbez ................. G01S 19/256 |
| 2019/0243472 A1* | 8/2019 | Stafford .................. A63F 13/30 |

OTHER PUBLICATIONS

"Xilix FPGA Serdes Dynamic Phase Interpolation for SDI Designs: Clean Reference Clocks Without the Expense of External VCXOS", Xilinx, 2012, retrieved from https://www.xilinx.com/publications/prod_mktg/CS1038_VCXO_ProdBrf_FINAL.pdf.

* cited by examiner

DEVICES, SYSTEMS, AND METHODS FOR REDUCING JITTER IN CONTROL SYSTEMS

BACKGROUND OF THE INVENTION

1. Field of the Invention

This invention relates generally to devices, systems, products, apparatus, and methods that are used for reducing jitter in control systems, and in one particular embodiment, to a device, system, product, apparatus, and method for reducing jitter in a motion control system.

2. Technical Considerations

A motion control system may be used to control moving parts of machines in a controlled manner. In some instances, components of a motion control system may include a motion controller (e.g., a main controller, a primary controller, etc.), an amplifier (e.g., an energy amplifier), and a prime mover (e.g., an actuator, an electric motor, etc.). A motion control system may be an open-loop motion control system or a closed-loop motion control system. In an open-loop motion control system, the motion controller may communicate a command to the amplifier and the amplifier may communicate the command to the prime mover. The motion controller may not be able to determine if the prime mover performed a desired motion event associated with the command. In a closed-loop motion control system, the motion controller may communicate a command to the amplifier, the amplifier may communicate the command to the prime mover, and the prime mover may perform a desired motion event associated with the command. The prime mover may communicate a signal to the motion controller (e.g., communicate a signal to the motion controller via the amplifier) and the motion controller may compensate for an error associated with a task (e.g., a desired motion event) performed by the prime mover.

SUMMARY OF THE INVENTION

Clause 1: A system for reducing jitter in a motion control system, comprising: at least one drive device programmed or configured to: receive a data signal associated with a time base of a controller device in a motion control system; determine a frequency of the time base of the controller device based on the data signal associated with the time base of the controller device; determine a frequency adjustment to be made to a time base of the at least one drive device based on the frequency of the time base of the controller device; adjust a frequency of the time base of the at least one drive device based on the frequency adjustment; and provide a data signal associated with the time base of the at least one drive device.

Clause 2: The system of clause 1, wherein, when receiving the data signal associated with the time base of the controller device in the motion control system, the at least one drive device is programmed or configured to: receive serial data associated with the time base of the controller device in the motion control system via a serial communication bus.

Clause 3: The system of any of clauses 1 and 2, wherein, when determining the frequency adjustment to be made to the time base of the at least one drive device, the at least one drive device is programmed or configured to: determine the frequency adjustment to be made to the time base of the at least one drive device based on the frequency of the time base of the controller device independent of data associated with a time synchronization process of the motion control system.

Clause 4: The system of any of clauses 1-3, wherein, when determining the frequency adjustment to be made to the time base of the at least one drive device based on the frequency of the time base of the controller device independent of the data associated with the time synchronization process, the at least one drive device is programmed or configured to: determine the frequency adjustment to be made to a time base of the at least one drive device based on the frequency of the time base of the controller device independent of timestamp data associated with a timestamp for the time synchronization process of the motion control system.

Clause 5: The system of any of clauses 1-4, wherein, when adjusting the frequency of the time base of the at least one drive device based on the frequency adjustment, the at least one drive device is programmed or configured to: adjust the frequency of the time base of the at least one drive device to correspond to the frequency of the time base of the controller device based on the frequency adjustment.

Clause 6: The system of any of clauses 1-5, wherein the at least one drive device is a first drive device and wherein, when providing the data signal associated with the time base of the first drive device, the first drive device is programmed or configured to: provide the data signal associated with the time base of the first drive device to a second drive device that is downstream of the first drive device with regard to a serial communication link.

Clause 7: The system of any of clauses 1-6, wherein the at least one drive device is further programmed or configured to: execute a control event based on the frequency of the time base of the at least one drive device.

Clause 8: A method for reducing jitter in a motion control system, comprising: receiving, with at least one drive device, a data signal associated with a time base of a controller device in a motion control system; determining, with the at least one drive device, a frequency of the time base of the controller device based on the data signal associated with the time base of the controller device; determining, with the at least one drive device, a frequency adjustment to be made to a time base of the at least one drive device based on the frequency of the time base of the controller device; adjusting, with the at least one drive device, a frequency of the time base of the at least one drive device based on the frequency adjustment; and providing, with the at least one drive device, a data signal associated with the time base of the at least one drive device.

Clause 9: The method of clause 8, wherein receiving the data signal associated with the time base of the controller device in the motion control system comprises: receiving serial data associated with the time base of the controller device in the motion control system via a serial communication bus.

Clause 10: The method of any of clauses 8 and 9, wherein determining the frequency adjustment to be made to the time base of the at least one drive device, the at least one drive device is programmed or configured to: determine the frequency adjustment to be made to the time base of the at least one drive device based on the frequency of the time base of the controller device independent of data associated with a time synchronization process of the motion control system.

Clause 11: The method of any of clauses 8-10, wherein determining the frequency adjustment to be made to the time base of the at least one drive device based on the frequency of the time base of the controller device independent of the data associated with the time synchronization process comprises: determining a frequency adjustment to be made to the time base of the at least one drive device based on the frequency of the time base of the controller device independent of timestamp data associated with a timestamp for the time synchronization process of the motion control system.

Clause 12: The method of any of clauses 8-11, wherein adjusting the frequency of the time base of the at least one drive device based on the frequency adjustment comprises: adjusting the frequency of the time base of the at least one drive device to correspond to the frequency of the time base of the controller device based on the frequency adjustment.

Clause 13: The method of any of clauses 8-12, wherein the at least one drive device is a first drive device and wherein providing the data signal associated with the time base of the first drive device comprises: providing the data signal associated with the time base of the first drive device to a second drive device that is downstream of the first drive device with regard to a serial data communication link.

Clause 14: The method of any of clauses 8-13, further comprising: executing a control event based on the frequency of the time base of the at least one drive device.

Clause 15: A computer program product for reducing jitter in a motion control system, the computer program product comprising at least one non-transitory computer-readable medium including one or more instructions that, when executed by at least one drive device, cause the at least one drive device to: receive a data signal associated with a time base of a controller device in a motion control system; determine the frequency of the time base of the controller device based on the data signal associated with the time base of the controller device; determine a frequency adjustment to be made to a time base of the at least one drive device based on the frequency of the time base of the controller device; adjust a frequency of the time base of the at least one drive device based on the frequency adjustment; and provide a data signal associated with the time base of the at least one drive device.

Clause 16: The computer program product of clause 15, wherein the one or more instructions that cause the at least one drive device to receive the data signal associated with the time base of the controller device in the motion control system, cause the at least one drive device to: receive serial data associated with the time base of the controller device in the motion control system via a serial communication bus.

Clause 17: The computer program product of any of clauses 15 and 16, wherein the one or more instructions that cause the at least one drive device to determine the frequency adjustment to be made to the time base of the at least one drive device, the at least one drive device is programmed or configured to: determine the frequency adjustment to be made to the time base of the at least one drive device based on the frequency of the time base of the controller device independent of data associated with a time synchronization process of the motion control system.

Clause 18: The computer program product of any of clauses 15-17, wherein the one or more instructions that cause the at least one drive device to determine the frequency adjustment to be made to the time base of the at least one drive device based on the frequency of the time base of the controller device independent of the data associated with the time synchronization process, cause the at least one drive device to: determine a frequency adjustment to be made to the time base of the at least one drive device based on the frequency of the time base of the controller device independent of timestamp data associated with a timestamp for the time synchronization process of the motion control system.

Clause 19: The computer program product of any of clauses 15-18, wherein the one or more instructions that cause the at least one drive device to adjust the frequency of the time base of the at least one drive device based on the frequency adjustment, cause the at least one drive device to: adjust the frequency of the time base of the at least one drive device to correspond to the frequency of the time base of the controller device based on the frequency adjustment.

Clause 20: The computer program product of any of clauses 15-19, wherein the one or more instructions further cause the at least one drive device to: execute a control event based on the frequency of the time base of the at least one drive device.

DETAILED DESCRIPTION OF THE INVENTION

Figure 1:
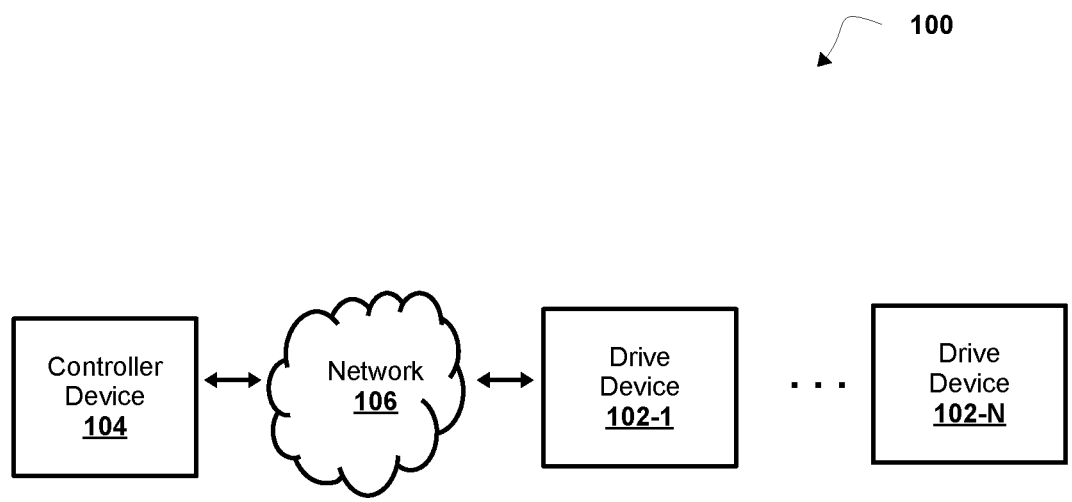
FIG. 1 is a diagram of a non-limiting embodiment of an environment in which systems and/or methods, described herein, may be implemented.

The following detailed description of non-limiting embodiments refers to the accompanying drawings. The same reference numbers in different drawings may identify the same or similar elements. Further, the description that follows is with regard to motion control systems, however, non-limiting embodiments of the present invention may be applicable to control systems generally.

In some non-limiting embodiments, a motion control system may include a plurality of drive devices and a controller device that controls the plurality of drive devices. For example, the plurality of drive devices of the motion control system may receive a signal (e.g., a control signal, a data signal, etc.) from the controller device of the motion control system. Each drive device may receive the signal and implement a synchronized motion (e.g., a synchronized motion of one or more motion axes of a drive device) based on the signal received from the controller.

In some non-limiting embodiments, a motion control system may have a distributed architecture in which not all motion axes of a plurality of drives are controlled by the same controller device (e.g., a drive device that acts as a controller device). For example, a motion control system may have a distributed architecture in which a first drive device of the plurality of drive devices receives a control signal from the controller device and the first drive device provides a control signal to a second drive device that is downstream of the first drive device in the motion control system. Each drive device of the motion control system may have a time base (e.g., a clock, a clock source, a local clock source that is a component of the drive device, such as an internal clock source, etc.) associated with that drive device and the time bases of each of the drive devices may be synchronized in time. In some non-limiting embodiments, the time base of a drive device may include an electronic oscillator, such as crystal oscillator.

In some non-limiting embodiments, a plurality of drive devices in a motion control system with a distributed architecture may communicate (e.g., via a serial communication bus) and the time bases of each of the plurality of drive devices may be synchronized in time based on a time synchronization process. In some non-limiting embodiments, the time bases of each of the plurality of drive devices may be synchronized in time based on a time synchronization process that includes a controller device of the motion control system communicating a signal that includes information associated with the time base of the controller device. For example, a controller device in the motion control system may provide a signal to the plurality of drive devices that includes a data packet (e.g., a "heartbeat" data packet) that includes the information associated with the time base of the controller device. Each drive device may receive the signal (e.g., receive the signal from the controller device, receive the signal from another drive device, receive the signal from another drive device that is upstream with regard to a serial communication link, etc.) and each drive device may use the information associated with the time base of the controller device to adjust the time base of the drive device to correspond to the time base of the controller device.

When the plurality of drive devices are used together to perform a synchronized motion in a motion control system, control events may be performed at the same time on each of the plurality of drive devices, based on the time base of each of the plurality of drive devices, so that the motion axes of the plurality of drive devices are coordinated. Deviation from a time at which a first drive device of a plurality of drive devices performs a control event to a time at which a second drive device of the plurality of drive devices performs a control event associated with the control event of the first drive, may result in an error (e.g., a lack of coordination) in the motion of a motion axis of the first drive device and the motion of a motion axis of the second drive device.

Furthermore, a time synchronization process may be required to occur periodically so that the time bases of the drive devices in a motion control system remain synchronized in time, because the time bases of the drive devices may drift apart over time. For example, each drive device in a motion control system may include a counter that has a count value based on a time base of the drive device. If a counter of a first drive device is synchronized in time with a counter of a second drive device, for example, based on a time synchronization process, the counter of the first drive device and the counter of the second drive device may each have a count value that is the same, or the count values may have a fixed offset, at a specified time interval. However, as the time bases of each drive device drift apart, the count values may differ, or the offset between the count values may differ, at a specified time interval.

In some non-limiting embodiments, a time synchronization process may synchronize the first drive device and the second drive device by changing a count value on a counter of the second drive to correspond to a count value on a counter of the first drive. When the count value is changed on the counter of the second drive, a time interval (e.g., a real-time interval) between a first control event (e.g., a previous control event) and a second control event (e.g., a subsequent control event) that are performed on the second drive may be greater than or less than a predetermined time interval between control events in the motion control system. As used herein, jitter refers to the deviation of a time interval between a first control event and a second control event from a predetermined time interval between subsequent control events in a motion control system. As jitter is introduced into a motion control system, the drives of the motion control system may not be able to perform a synchronized motion, may not be able to perform a synchronized motion repeatedly, and/or may lack accurate regulation (e.g., velocity regulation) of the motion axes of the drives.

Non-limiting embodiments, as disclosed herein, include devices, systems, methods, apparatus, and computer program products for reducing jitter in a motion control system are disclosed herein. In some non-limiting embodiments, a system may include at least one drive device that may receive data associated with a time base of a controller device in a motion control system, determine the frequency of the time base of the controller device based on the data associated with the time base of the controller device, determine a frequency adjustment to be made to a time base of the at least one drive device based on the frequency of the time base of the controller device, and adjust a frequency of the time base of the at least one drive based on the frequency adjustment. In this way, non-limiting embodiments of the invention reduce an amount of jitter between control events on a drive device in a motion control system, thereby improving the repeatability of synchronized motion that is coordinated with a plurality of drive devices in the motion control system, as well as improving regulation (e.g., velocity regulation) of the motion axes of the plurality of drive devices. In some non-limiting embodiments, the at least one drive device may provide data associated with the time base of the at least one drive device. For example, the at least one drive device may provide data associated with the time base of the at least one drive device to another drive device in the motion control system. In this way, non-limiting embodiments of the invention reduce an amount of jitter between control events on a plurality of drive devices in a motion control system.

Referring now to FIG. 1, FIG. 1 is a diagram of a non-limiting embodiment of an environment 100 in which systems and/or methods, described herein, may be implemented. As shown in FIG. 1, environment 100 includes one or more drive devices 102-1 through 102-N (referred to collectively as "drive devices 102," and individually as "drive device 102"), controller device 104, and network 106. Systems and/or devices of environment 100 (e.g., drive device 102-1 and drive device 102-N) may interconnect via wired connections, wireless connections, or a combination of wired and wireless connections.

In some non-limiting embodiments, drive device 102 includes one or more devices associated with performing a task in a motion control system. For example, drive device 102 may include a distributed drive, a variable frequency drive, a prime mover, an actuator (e.g., a valve, a solenoid, etc.), a motor (e.g., an electric motor, a servomotor, etc.), and/or the like. In some non-limiting limiting embodiments, drive device 102 may include one or more devices capable of receiving, generating, storing, processing, and/or providing information associated with performing a task in a motion control system. For example, drive device 102 may include a computing device, a computer, a processor, a microprocessor, a microcontroller, an integrated circuit, an FPGA, and/or the like. In some non-limiting embodiments, drive device 102 may have a communication link (e.g., a point-to-point serial communication link, a full duplex serial communication link) to a drive device that is immediately upstream of drive device 102 and/or a communication link to a drive device that is immediately downstream of drive device 102. For example, drive device 102 may have a communication link to a drive device that is immediately upstream of drive device 102 and/or a communication link to a drive device that is immediately downstream of drive device 102, and drive device 102 may receive data from the drive devices and/or transmit data to the drive devices simultaneously. Further details regarding non-limiting embodiments of drive device 102 are provided below with regard to FIG. 2.

In some non-limiting embodiments, controller device 104 includes one or more devices associated with controlling one or more devices in a motion control system. For example, controller device 104 may include a computing device, a computer, a processor, a microprocessor, a microcontroller, an integrated circuit, a field programmable gate array (FPGA), and/or the like. In some non-limiting embodiments, drive device 102 may include one or more devices capable of receiving, generating, storing, processing, and/or providing information associated with controlling one or more devices (e.g., one or more drive devices 102) in a motion control system. In some non-limiting embodiments, controller device 104 is upstream of (e.g., upstream with regard to communication to) drive devices 102. In some non-limiting embodiments, controller device 104 may include a drive device (e.g., drive device 102).

In some non-limiting embodiments, network 106 may include one or more wired and/or wireless networks. For example, network 106 may include a communications link, a computer network, an Internet Protocol (IP) network, an Ethernet network, a bus network, a fiber optic-based network, a local area network (LAN), a wide area network (WAN), a metropolitan area network (MAN), a telephone network (e.g., the public switched telephone network (PSTN)), a private network, an ad hoc network, an intranet, the Internet, a cloud computing network, a cellular network (e.g., a long-term evolution (LTE) network, a third generation (3G) network, a fourth generation (4G) network, a code division multiple access (CDMA) network, etc.), a public land mobile network (PLMN), and/or the like, and/or a combination of these or other types of networks. In some non-limiting embodiments, network 106 may include a point-to-point serial or parallel communication link over copper wire or fiber optic cable. In some non-limiting embodiments, network 106 may interconnect a plurality of drive devices 102.

The number and arrangement of systems, devices, and networks shown in FIG. 1 are provided as an example. There may be additional systems, devices, and/or networks, fewer systems, devices, and/or networks, different systems, devices, and/or networks, or differently arranged systems, devices, and/or networks than those shown in FIG. 1. Furthermore, two or more systems or devices shown in FIG. 1 may be implemented within a single system or a single device, or a single system or a single device shown in FIG. 1 be implemented as multiple, distributed systems or devices. Additionally or alternatively, a set of systems or a set of devices (e.g., one or more systems, one or more devices) of environment 100 may perform one or more functions described as being performed by another set of systems or another set of devices of environment 100.

Figure 2:
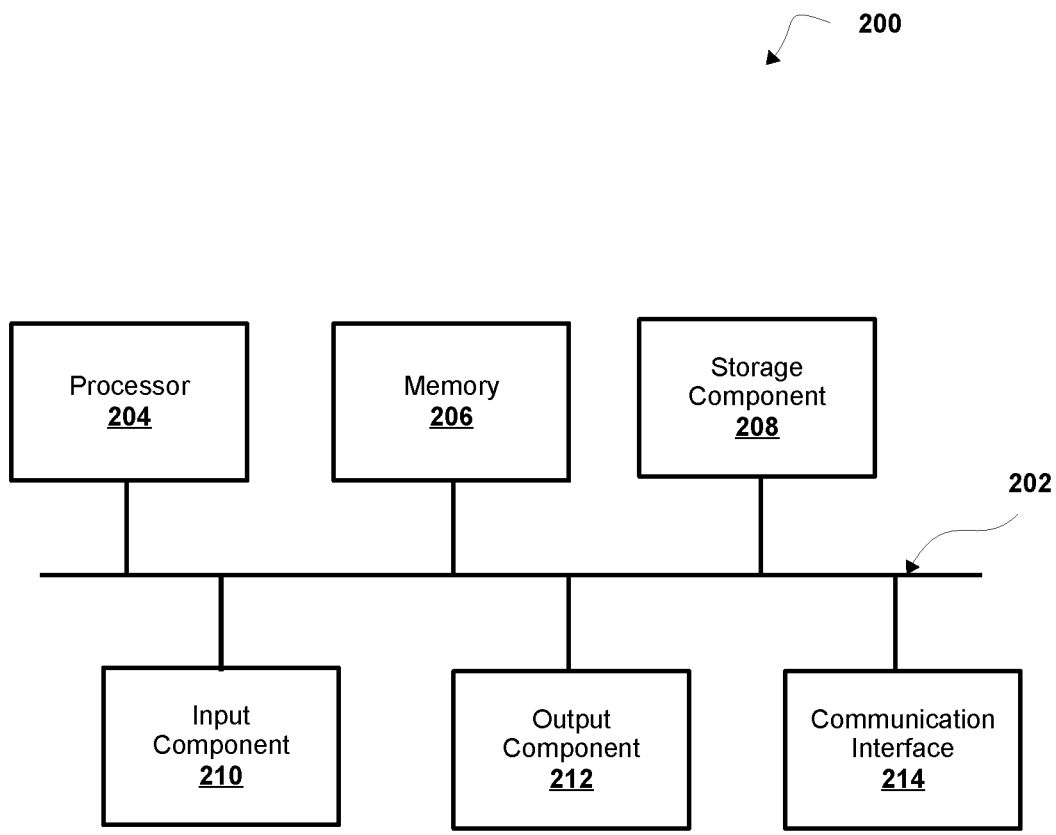
FIG. 2 is a diagram of a non-limiting embodiment of components of a drive shown in FIG. 1.

Referring now to FIG. 2, FIG. 2 is a diagram of example components of a device 200. Device 200 may correspond to drive device 102 and/or controller device 104. In some non-limiting embodiments, drive device 102 and/or controller device 104 may include at least one device 200 and/or at least one component of device 200. As shown in FIG. 2, device 200 may include bus 202, processor 204, memory 206, storage component 208, input component 210, output component 212, and communication interface 214.

Bus 202 may include a component that permits communication among the components of device 200. In some non-limiting embodiments, processor 204 may be implemented in hardware, firmware, or a combination of hardware and software. For example, processor 204 may include a processor (e.g., a central processing unit (CPU), a graphics processing unit (GPU), an accelerated processing unit (APU), etc.), a microprocessor, a digital signal processor (DSP), and/or any processing component (e.g., an FPGA, an application-specific integrated circuit (ASIC), etc.) that can be programmed to perform a function. Memory 206 may include random access memory (RAM), read only memory (ROM), and/or another type of dynamic or static storage device (e.g., flash memory, magnetic memory, optical memory, etc.) that stores information and/or instructions for use by processor 204.

Storage component 208 may store information and/or software related to the operation and use of device 200. For example, storage component 208 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

Input component 210 may include a component that permits device 200 to receive information, such as via user input (e.g., a touch screen display, a keyboard, a keypad, a mouse, a button, a switch, a microphone, etc.). Additionally or alternatively, input component 210 may include a sensor for sensing information (e.g., a global positioning system (GPS) component, an accelerometer, a gyroscope, an actuator, etc.). Output component 212 may include a component that provides output information from device 200 (e.g., a display, a speaker, one or more light-emitting diodes (LEDs), etc.). In some non-limiting embodiments, output information may include output associated with a command to a system component (e.g., for the purpose of motion control), such as an analog electrical signal, a digital electrical signal, and/or a current provided to a system component (e.g., a drive device, a motor, an electric motor, etc.).

Communication interface 214 may include a transceiver-like component (e.g., a transceiver, a separate receiver and transmitter, etc.) that enables device 200 to communicate with other devices, such as via a wired connection, a wireless connection, or a combination of wired and wireless connections. Communication interface 214 may permit device 200 to receive information from another device and/or provide information to another device. For example, communication interface 214 may include an Ethernet interface, an optical interface, a coaxial interface, an infrared interface, a radio frequency (RF) interface, a universal serial bus (USB) interface, a Wi-Fi® interface, a cellular network interface, and/or the like.

Device 200 may perform one or more processes described herein. Device 200 may perform these processes based on processor 204 executing software instructions stored by a computer-readable medium, such as memory 206 and/or storage component 208. A computer-readable medium (e.g., a non-transitory computer-readable medium) is defined herein as a non-transitory memory device. A memory device includes memory space located inside of a single physical storage device or memory space spread across multiple physical storage devices.

Software instructions may be read into memory 206 and/or storage component 208 from another computer-readable medium or from another device via communication interface 214. When executed, software instructions stored in memory 206 and/or storage component 208 may cause processor 204 to perform one or more processes described herein. Additionally or alternatively, hardwired circuitry may be used in place of or in combination with software instructions to perform one or more processes described herein. Thus, embodiments described herein are not limited to any specific combination of hardware circuitry and software.

The number and arrangement of components shown in FIG. 2 are provided as an example. In some non-limiting embodiments, device 200 may include additional components, fewer components, different components, or differently arranged components than those shown in FIG. 2. Additionally or alternatively, a set of components (e.g., one or more components) of device 200 may perform one or more functions described as being performed by another set of components of device 200.

Figure 3:
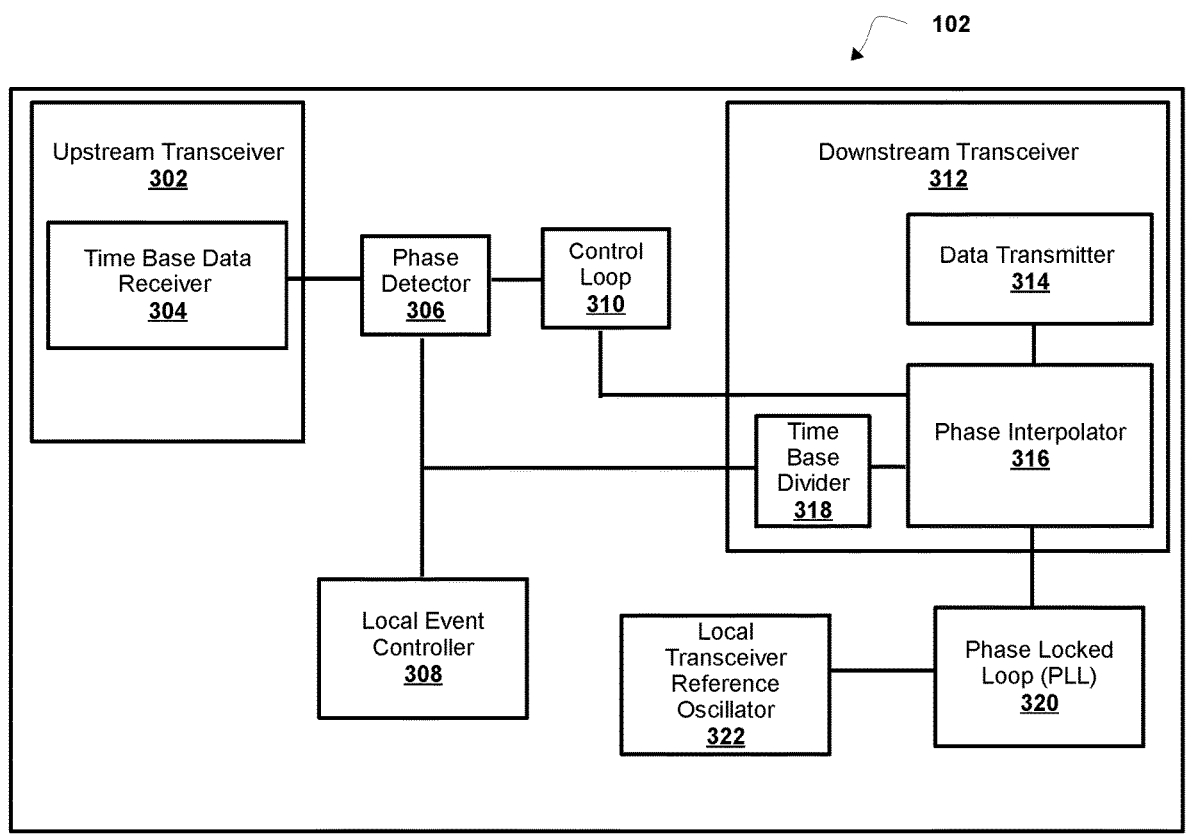
FIG. 3 is a diagram of a non-limiting embodiment of components of a drive shown in FIG. 1.

Referring now to FIG. 3, FIG. 3 is a diagram of example components of a drive device 102. As shown in FIG. 3, drive device 102 may include upstream transceiver 302, phase detector 306, local event controller 308, control loop 310, downstream transceiver 312, phase locked loop (PLL) 320, and local transceiver reference oscillator 322. Upstream transceiver 302 may include time base data receiver 304 and downstream transceiver 312 may include data transmitter 314, phase interpolator 316, and time base divider 318.

In some non-limiting embodiments, upstream transceiver 302 and/or downstream transceiver 312 may include a transceiver-like component (e.g., a transceiver, a separate receiver and transmitter, data transmitter 314, etc.) that enables drive device 102 to communicate with other devices, such as via a wired connection, a wireless connection, or a combination of wired and wireless connections. Upstream transceiver 302 and/or downstream transceiver 312 may permit drive device 102 to receive information from another device and/or provide information to another device. For example, upstream transceiver 302 and/or downstream transceiver 312 may include an optical interface, a coaxial interface, an infrared interface, a radio frequency (RF) interface, and/or the like.

In some non-limiting embodiments, time base data receiver 304 may determine the time base of an upstream device (e.g., another drive device 102 that is upstream, a controller device, controller device 104, etc.) based on a data signal received by time base data receiver 304. For example, time base data receiver 304 may receive the data signal, where the data signal is associated with a first frequency (e.g., the data signal has a first frequency) and the time base of the upstream device is associated with a second frequency (e.g., the time base of the upstream device has a second frequency). In such an example, the first frequency may be greater than the second frequency (e.g., the first frequency may be 20 times greater than the second frequency).

In some non-limiting embodiments, phase detector 306 may detect a phase difference between a phase of the time base of an upstream drive device and/or a controller device determined by time base data receiver 304 and a phase of the time base of drive device 102 after the frequency of the time base of drive device 102 has been adjusted from an initial frequency. In some non-limiting embodiments, phase detector 306 may provide an error signal to control loop 310 based on the phase difference.

In some non-limiting embodiments, control loop 310 may determine a phase adjustment (e.g., an additional phase adjustment) to be made to the time base of drive device 102 based on the error signal received from phase detector 306. In some non-limiting embodiments, phase interpolator 316 may provide a time base that is based on a phase adjustment in the phase of the time base of PLL 320, where the phase adjustment (e.g., an additional phase adjustment) was determined by control loop 310.

In some non-limiting embodiments, data transmitter 314 may receive data in parallel as an input (e.g., data in parallel as an input at the second frequency of the time base of the upstream drive device) and provide data in serial as an output. In some non-limiting embodiments, data transmitter 314 may transmit a data signal at the first frequency of the data signal received by time base data receiver 304. In some non-limiting embodiments, data transmitter 314 may receive a data signal at the second frequency of the time base of the upstream drive device.

In some non-limiting embodiments, time base divider 318 may divide the time base provided by phase interpolator 316 by a value, where the value is based on the magnitude of the difference between the first frequency of the data signal received by time base data receiver 304 and the second frequency of the time base of the upstream drive device. In one example, time base divider 318 may divide the time base provided by phase interpolator 316 by a value of 20, where the first frequency of the data signal (e.g., 2.5 GHz) received by time base data receiver 304 is 20 times greater than the second frequency of the time base (e.g., 125 MHz) of the upstream device. In some non-limiting embodiments, time base divider 318 may provide a time base (e.g., a local time base of drive device 102, a local transceiver time base of drive device 102, a time base associated with local transceiver reference oscillator 322, etc.) to phase detector 306 and/or local event controller 308. For example, time base divider 318 may provide a time base of drive device 102 to phase detector 306 and/or local event controller 308 after the frequency of the time base of drive device 102 (e.g., 125 MHz) has been adjusted from an initial frequency by phase interpolator 316. In some non-limiting embodiments, time base divider 318 may provide a time base to phase detector 306 and/or local event controller 308 where the time base has the second frequency of the time base (e.g., 125 MHz) of the upstream device.

In some non-limiting embodiments, PLL 320 may multiply the local reference time base of drive device 102 by a value, where the value is based on the magnitude of the difference between the first frequency of the data signal received by time base data receiver 304 and the second frequency of the time base of the upstream drive device. In one example, PLL 320 may multiply the local reference time base of drive device 102 by a value of 20, where the first frequency of the data signal (e.g., 2.5 GHz) received by time base data receiver 304 is 20 times greater than the second frequency of the time base (e.g., 125 MHz) of the upstream device. In some non-limiting embodiments, local transceiver reference oscillator 322 provides a local reference time base for a drive device (e.g., drive device 102). For example, local transceiver reference oscillator 322 provides a local reference time base for drive device 102 where the local reference time base has the second frequency of the time base of the upstream device.

In some non-limiting embodiments, local event controller 308 may receive data associated with control events, synchronized motion events, and/or the like. In some non-limiting embodiments, local event controller 308 may provide a command to a motion axis associated with drive device 102. For example, local event controller 308 may sample feedback from a motion axis associated with drive device 102 and provide a command to a motion axis associated with drive device 102 based on the feedback.

Figure 4:
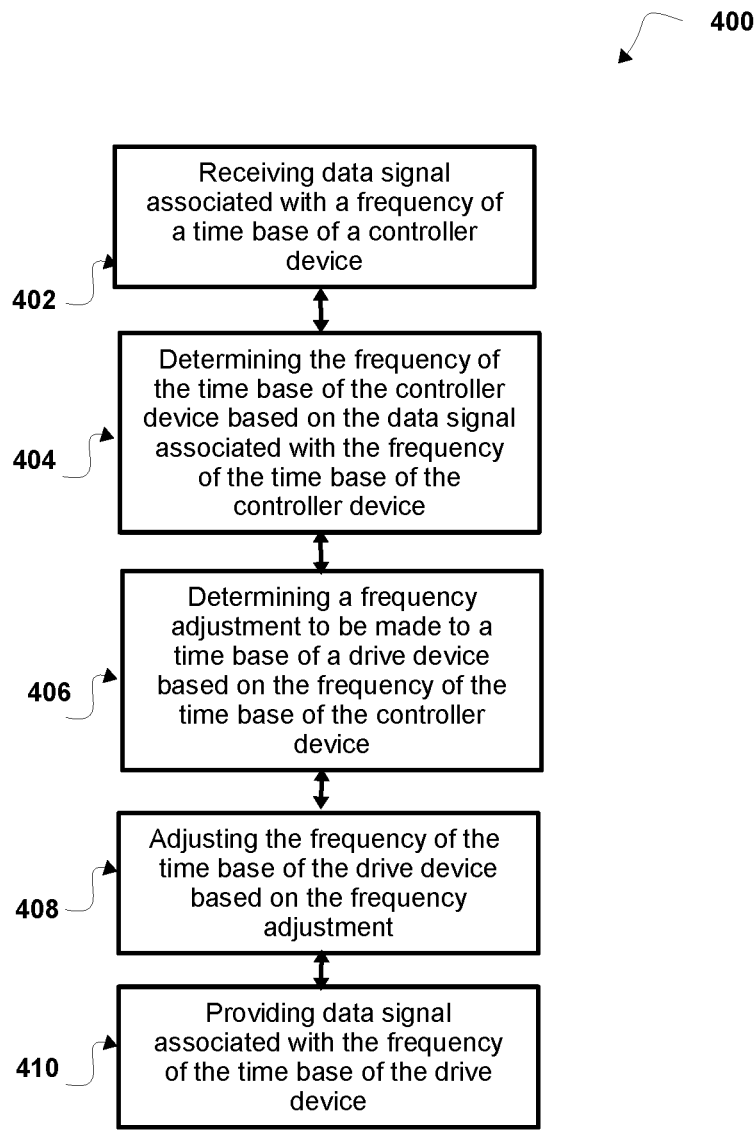
FIG. 4 is a flowchart of a non-limiting embodiment of a process for reducing jitter in a motion control system.

Referring now to FIG. 4, FIG. 4 is a flowchart of a non-limiting embodiment of a process 400 for reducing jitter in a control system. In some non-limiting embodiments, one or more of the steps of process 400 may be performed (e.g., completely, partially, etc.) by drive device 102 (e.g., drive device 102-1, drive device 102-N, etc.). In some non-limiting embodiments, one or more of the steps of process 400 may be performed (e.g., completely, partially, etc.) by another device or a group of devices separate from or including drive device 102, such as controller device 104.

As shown in FIG. 4, at step 402, process 400 includes receiving a data signal associated with a frequency of a time base of a controller device (e.g., a main controller, a primary controller, etc.). For example, drive device 102 (e.g., drive device 102-1, drive device 102-N) may receive a data signal (e.g., a serial data signal, a control signal, a command signal, a trigger signal, etc.) associated with a frequency of a time base (e.g., a clock, an oscillator, an oscillator circuit, an electronic oscillator, an electronic oscillator circuit, etc.) of controller device 104 of a control system (e.g., a motion control system). In some non-limiting embodiments, drive device 102 (e.g., drive device 102-1) may receive the data signal associated with the frequency of the time base of controller device 104 from controller device 104 and/or another drive device 102 (e.g., drive device 102-N).

In some non-limiting embodiments, the data signal associated with the frequency of the time base of controller device 104 may include a data signal associated with a multiple of the frequency (e.g., the frequency, twice the frequency, etc.) of a local time base of controller device 104. For example, the data signal may be communicated at a multiple of the frequency of a local time base of controller device 104. In such an example, controller device 104 may generate the data signal based on the frequency of a local time base of controller device 104. In some non-limiting embodiments, the data signal associated with the frequency of the time base of controller device 104 may include a serial data signal associated with the frequency of the time base. For example, the data signal associated with the frequency of the time base of controller device 104 may include a serial data signal communicated (e.g., transmitted) at a multiple of the frequency of a local time base of controller device 104. In some non-limiting embodiments, the timing of the bits of the serial data signal is associated with the local time base of controller device 104. For example, the timing of communication of the bits of the serial data signal may be associated with a multiple of the frequency of the local time base of controller device 104. Additionally or alternatively, the local time base may be derived from the local reference time base of controller device 104.

In some non-limiting embodiments, drive device 102 may receive the data signal as a data stream (e.g., a serial data stream or a non-serial data stream) from controller device 104. For example, drive device 102 may receive the data signal as a serial data stream from which a periodic signal can be extracted by drive device 102. In some non-limiting embodiments, the periodic signal may include a recovered time base signal associated with a frequency of the data bits of the data stream. Additionally or alternatively, the periodic signal may be a waveform (e.g., a sinusoidal waveform, a square waveform, a triangular waveform, a sawtooth waveform, etc.).

In some non-limiting embodiments, drive device 102 may be connected to controller device 104 via a serial communication bus. For example, drive device 102 may receive a data signal from controller device 104 via a serial communication bus. In some non-limiting embodiments, drive device 102 may be connected to another drive device 102 via a serial communication bus. For example, drive device 102 may receive a data signal from another drive device 102 (e.g., another drive device 102 that is immediately upstream of drive device 102) via a serial communication bus.

In some non-limiting embodiments, drive device 102 may be connected to controller device 104 and/or another drive device 102 via a shared communication bus. For example, drive device 102 may receive data from controller device 104 and/or another drive device 102 via the shared communication bus. In such an example, controller device 104 may provide a data signal to drive devices 102 simultaneously via the shared communication bus.

As further shown in FIG. 4, at step 404, process 400 includes determining the frequency of the time base of the controller based on the data signal associated with the frequency of the time base of the controller. For example, drive device 102 (e.g., drive device 102-1, drive device 102-N) may determine the frequency of the time base of controller device 104 based on the data signal associated with the frequency of the time base of the controller. In some non-limiting embodiments, a transceiver (e.g., upstream transceiver 302, time base data receiver 304, etc.) of drive device 102 determines the frequency of the time base of controller device 104 based on the data signal associated with the frequency of the time base of the controller device. In some non-limiting embodiments, drive device 102 may determine the frequency of the time base of controller device 104 based on the data signal associated with the frequency of the time base of controller device 104. In some non-limiting embodiments, the frequency of the time base of controller device 104 may be within the range of tens to hundreds of megahertz. In one example, the frequency of the time base of controller device 104 equals 125 MHz.

In some non-limiting embodiments, drive device 102 (e.g., drive device 102-1, drive device 102-N) may determine the frequency of the time base of controller device 104 based on receiving the data signal associated with the frequency of the time base of controller device 104. For example, drive device 102 (e.g., drive device 102-1, drive device 102-N) may determine the frequency of the time base of controller device 104 based on receiving the data signal associated with the frequency of the time base of controller device 104 from controller device 104 and/or another drive device 102 (e.g., drive device 102-N).

In some non-limiting embodiments, drive device 102 may determine the frequency of the time base of controller device 104 based on a frequency of (e.g., a frequency that can be extracted from) a data signal received by drive device 102. For example, drive device 102 may receive a data signal from which a periodic signal (e.g., a recovered time base signal) can be extracted. Drive device 102 may determine a frequency of the periodic signal based on a waveform of the periodic signal. In some non-limiting embodiments, drive device 102 may determine a period and/or a wavelength of the waveform of the periodic signal and drive device 102 may determine a frequency of the waveform of the periodic signal based on the period and/or the wavelength. In some non-limiting embodiments, drive device 102 may determine a frequency of the periodic signal based on transitions in a waveform of the data signal received by drive device 102.

As further shown in FIG. 4, at step 406, process 400 includes determining a frequency adjustment to be made to a time base of a drive device based on the frequency of the time base of the controller device. For example, drive device 102 (e.g., drive device 102-1, drive device 102-N) may determine a frequency adjustment (e.g., an amount of frequency adjustment in parts-per-million) to be made to the frequency of the time base of drive device 102 based on the frequency of the time base of controller device 104. In some non-limiting embodiments, a frequency adjustment may be within the range of plus or minus 150 parts-per-million.

In some non-limiting embodiments, drive device 102 may determine the frequency adjustment to be made to the frequency of the time base of drive device 102 by comparing the frequency of the time base of drive device 102 and the frequency of the time base of controller device 104. Drive device 102 may determine a difference between the frequency of the time base of drive device 102 and the frequency of the time base of controller device 104. Drive device 102 may determine that the difference is the frequency adjustment to be made to the frequency of the time base of drive device 102.

In some non-limiting embodiments, drive device 102 may determine the frequency adjustment to be made to the frequency of the time base of drive device 102 based on the frequency of the time base of the controller device independent of data associated with a time synchronization process of the motion control system. For example, drive device 102 may determine the frequency adjustment to be made to the time base of drive device 102 based on the frequency of the time base of controller device 104 independent of timestamp data associated with a timestamp for the time synchronization process of the motion control system.

As further shown in FIG. 4, at step 408, process 400 includes adjusting the frequency of the time base of the drive device based on the frequency adjustment. For example, drive device 102 (e.g., drive device 102-1, drive device 102-N) may adjust (e.g., increase, decrease, increment, decrement, etc.) the frequency of the time base (e.g., the local time base) of drive device 102 based on the frequency adjustment. In some non-limiting embodiments, drive device 102 may adjust the frequency of the time base of drive device 102 to correspond to the frequency of the time base of controller device 104 based on the frequency adjustment. For example, drive device 102 may adjust the frequency of the time base of drive device 102 based on the frequency adjustment so that the frequency of the time base (e.g., local time base) of drive device 102 is equal to the frequency of the time base (e.g., local time base) of controller device 104. In this way, the frequency of a time base (e.g., a local time base) of drive device 102 may be adjusted to correspond to the frequency of a time base (e.g., a local time base) of controller device 104, despite that each time base is derived from a different local reference time base.

In some non-limiting embodiments, drive device 102 may adjust the frequency of the time base of drive device 102 based on a time interval (e.g., periodically, a predetermined time interval, etc.). For example, drive device 102 may adjust the frequency of the time base of drive device 102 based on a time interval after receiving data associated with the frequency of the time base of controller device 104 from controller device 104 and/or another drive device 102.

In some non-limiting embodiments, drive device 102 may adjust the frequency of the time base of drive device 102 in hardware based on the frequency adjustment. For example, phase detector 306, control loop 310, and phase interpolator 316 may be implemented in hardware in an FPGA. Adjusting the frequency of the time base of drive device 102 in hardware can result in the frequency of the time base of drive device 102 more closely following the frequency of the time base of controller device 104 than if software were used to adjust the frequency of the time base of drive device 102.

In some non-limiting embodiments, drive device 102 may use a local time base of drive device 102 to determine when a control event is executed (e.g., a point in time when a task associated with a control event is performed) on drive device 102. For example, drive device 102 may use a local time base of drive device 102 to determine when to perform a task associated with a control event associated with drive device 102. In some non-limiting embodiments, drive device 102 may use a local time base of drive device 102 to determine a time interval specified by a task associated with a control event and determine when to perform the task based on the time interval.

In some non-limiting embodiments, drive device 102 may adjust the frequency of the time base of drive device 102 to correspond to (e.g., to equal) the frequency of the time base of controller device 104 and drive device 102 may synchronize a counter (e.g., a local counter) of drive device 102 with a counter of controller device 104 based on a synchronization method. In this way, the count value of the counter of drive device 102 remains synchronized with the count value of the counter of controller device 104 as long as drive device 102 adjusts the frequency of the time base (e.g., the local time base) of drive device 102 so that the time base of drive device 102 is equal to the frequency of the time base (e.g., the local time base) of controller device 104.

As further shown in FIG. 4, at step 410, process 400 includes providing data associated with the frequency of the time base of the drive device. For example, drive device 102 (e.g., drive device 102-1) may provide data associated with the frequency of the time base of drive device 102 to another drive device 102 (e.g., drive device 102-N). In some non-limiting embodiments, drive device 102 may provide data associated with the frequency of the time base of drive device 102 to another drive device 102 based on adjusting the frequency of the time base of drive device 102. For example, drive device 102 may adjust the frequency of the time base of drive device 102 based on a frequency adjustment and drive device 102 may provide the data associated with the frequency of the time base of drive device 102 after adjusting the frequency of the time base of drive device 102.

In some non-limiting embodiments, the data associated with the frequency of the time base of drive device 102 may include data associated with a multiple of the frequency of a local time base of drive device 102. In some non-limiting embodiments, the data associated with the frequency of the time base of drive device 102 may include serial data associated with the frequency of the time base. For example, the data associated with the frequency of the time base of drive device 102 may include serial data associated with the frequency of a local time base of drive device 102. In some non-limiting embodiments, the timing of the bits of the serial data is associated with the local time base of drive device 102. Additionally or alternatively, the local time base may be derived from the local reference time base of drive device 102.

In some non-limiting embodiments, drive device 102 may receive a signal associated with a control event. For example, drive device 102 may receive a signal associated with the control event from controller device 104 after drive device 102 adjusts the frequency of the time base of drive device 102 to be equal to the frequency of the time base of controller device 104. Additionally or alternatively, drive device 102 may execute a control event based on a predetermined time interval (e.g., periodically). In some non-limiting embodiments, drive device 102 may execute a control event based on a time base of drive device 102. For example, drive device 102 may execute the control event based on the time base of drive device 102 after drive device 102 adjusts the frequency of the time base of drive device 102 to be equal to the frequency of the time base of controller device 104. In some non-limiting embodiments, drive device 102 may execute the control event based on the time base of drive device 102 and a count value of a counter of drive device 102. For example, drive device 102 may execute the control event based on the time base of drive device 102 and a count value of a counter of drive device 102 after drive device 102 adjusts the frequency of the time base of drive device 102 to be equal to the frequency of the time base of controller device 104.

In some non-limiting embodiments, a control event may include an event associated with a command provided by controller device 104 of a motion control system to one or more drive devices (e.g., one or more drive devices 102) of the motion control system. For example, during a control event, controller device 104 may sample a signal provided by a drive device (e.g., drive device 102, a motion axis of drive device 102, etc.) and controller device 104 may provide a command to the drive device based on the signal. In such an example, controller device 104 may sample a feedback signal provided by the drive device and controller device 104 may provide an updated command, that is subsequent to sampling the feedback signal to the drive device based on the feedback signal.

In some non-limiting embodiments, a control event may include an event that occurs in controller device 104 of a motion control system and/or one or more drive devices 102 of the motion control system based on a predetermined time interval (e.g., periodically). For example, during a control event, drive device 102 may sample an input signal (e.g., the position feedback of a motion axis of drive device 102, etc.) provided to drive device 102 and drive device 102 may provide an output signal based on the input signal (e.g., the position command to a motion axis of drive device 102, etc.). In such an example, drive device 102 may sample a feedback signal provided to drive device 102 and/or another drive device (e.g., another drive device 102) and drive device 102 may provide an updated command to drive device 102 and/or the other drive device after sampling the feedback signal.

In some non-limiting embodiments, drive device 102 may receive a signal associated with a synchronized motion event. For example, drive device 102 may receive the signal associated with the synchronized motion event from controller device 104. In some non-limiting embodiments, drive device 102 may execute a synchronized motion event based on a predetermined time interval (e.g., periodically). In some non-limiting embodiments, drive device 102 may perform a task associated with the synchronized motion event.

Figure 5:
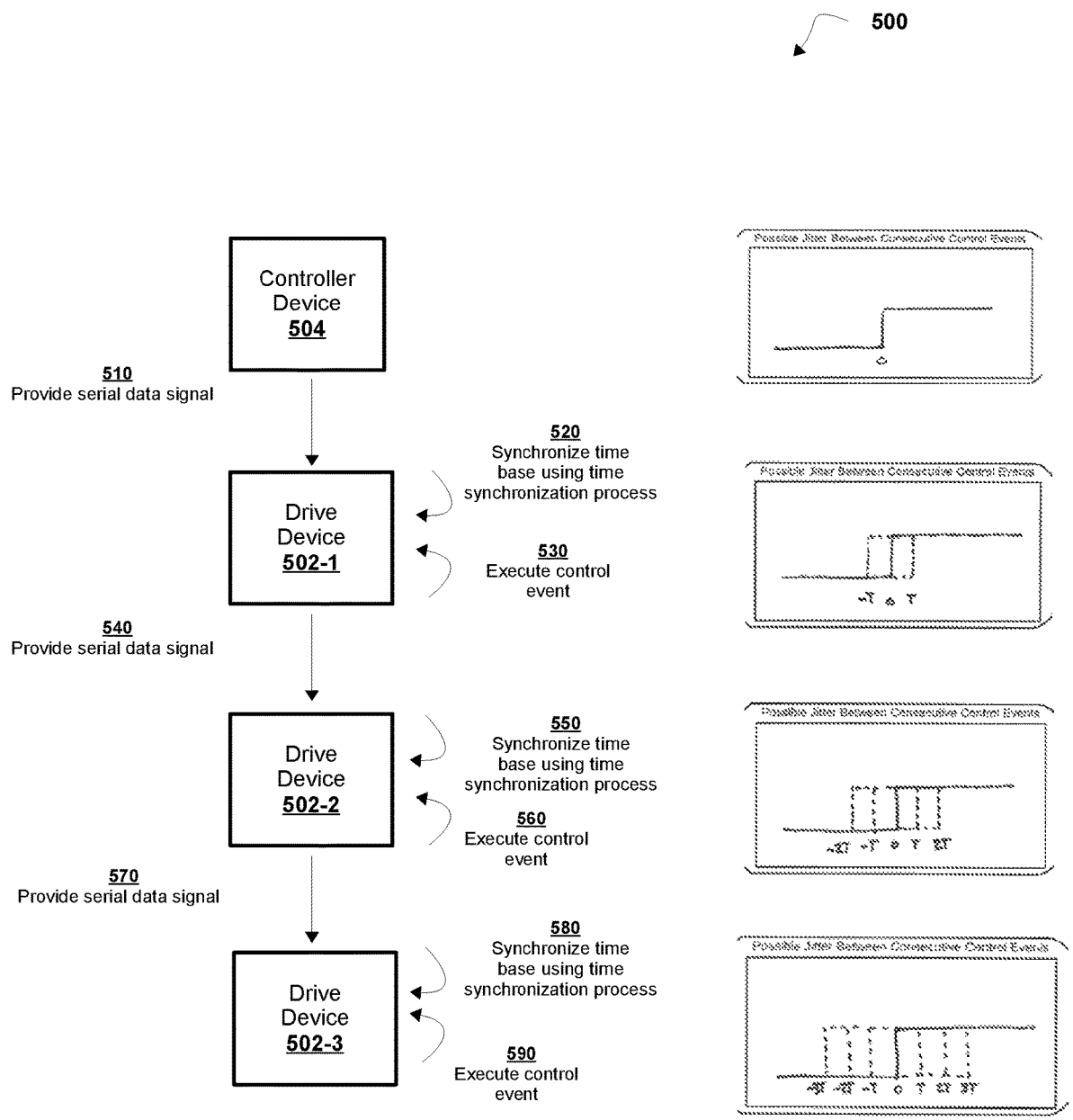
FIG. 5 is a diagram of an implementation of a non-limiting embodiment of a process disclosed herein.

FIG. 5 is a diagram of a non-limiting embodiment of an implementation 500 described herein. As shown in FIG. 5, implementation 500 may include controller device 504, drive device 502-1, drive device 502-2, and drive device 502-3. In some non-limiting embodiments, controller device 504 may be the same or similar to controller device 104. In some non-limiting embodiments, drive device 502-1, drive device 502-2, and/or drive device 502-3 may be the same or similar to drive device 102.

As shown by reference number 510 in FIG. 5, controller device 504 may provide a serial data signal to drive device 502-1. In some non-limiting embodiments, controller device 504 may provide the serial data signal to drive device 502-1 based on a frequency of a time base (e.g., a local transceiver clock) of controller device 504. In some non-limiting embodiments, drive device 502-1 may receive the serial data signal and process data associated with the serial data signal. As further shown by reference number 520 in FIG. 5, drive device 502-1 may synchronize a counter of drive device 502-1 using a time synchronization process. For example, drive device 502-1 may synchronize the counter of drive device 502-1 with the counter of controller 504 using the time synchronization process based on data (e.g., timestamp data) included in the serial data signal received by drive device 502-1.

In some non-limiting embodiments, drive device 502-1 may synchronize a time base of drive device 502-1 and a time base of controller device 504 by changing a count value on a counter of drive device 502-1 to correspond to a count value on a counter of controller device 504. As further shown by reference number 530 in FIG. 5, drive device 502-1 may execute a control event based on a predetermined time interval. In this way, when the count value is changed on the counter of drive device 502-1 between a first control event and a second control event (e.g., consecutive control events), the time interval between the consecutive control events may be greater than or less than a predetermined time interval between control events in the motion control system by a period T. In some non-limiting embodiments, the period T may be equal to the period of the time base (e.g., the local transceiver clock) of drive device 502-1. For example, the period T may be within a range of 2 nanoseconds to 40 nanoseconds. In one example, the period T is equal to 8 nanoseconds.

As further shown by reference number 540 in FIG. 5, drive device 502-1 may provide a serial data signal to drive device 502-2. In some non-limiting embodiments, drive device 502-1 may provide the serial data signal to drive device 502-2 based on a frequency of a time base (e.g., a local transceiver clock) of drive device 502-1. In some non-limiting embodiments, drive device 502-2 may receive the serial data signal and process data associated with the serial data signal. As further shown by reference number 550 in FIG. 5, drive device 502-2 may synchronize a counter of drive device 502-2 using a time synchronization process. For example, drive device 502-2 may synchronize the counter of drive device 502-2 with the counter of drive device 502-1 using the time synchronization process based on data (e.g., timestamp data) included in the serial data signal received by drive device 502-2.

In some non-limiting embodiments, drive device 502-2 may synchronize a time base of drive device 502-2 and a time base of drive device 502-1 by changing a count value on a counter of drive device 502-2 to correspond to a count value on a counter of drive device 502-1. As further shown by reference number 560 in FIG. 5, drive device 502-2 may execute a control event based on a predetermined time interval. In this way, when the count value is changed on the counter of drive device 502-2 between a first control event and a second control event (e.g., consecutive control events), the time interval between a first control event and a second control event (e.g., consecutive control events) may be greater than or less than a predetermined time interval between control events in the motion control system by a period 2 T.

In some non-limiting embodiments, the period 2 T may be based on the period of the time base (e.g., the local transceiver clock) of drive device 502-2. For example, the period 2 T may be within a range of 4 nanoseconds to 80 nanoseconds. In one example, the period 2 T is equal to 16 nanoseconds.

As further shown by reference number 570 in FIG. 5, drive device 502-2 may provide a serial data signal to drive device 502-3. In some non-limiting embodiments, drive device 502-2 may provide the serial data signal to drive device 502-3 based on a frequency of a time base (e.g., a local transceiver clock) of drive device 502-2. In some non-limiting embodiments, drive device 502-3 may receive the serial data signal and process data associated with the serial data signal. As further shown by reference number 580 in FIG. 5, drive device 502-3 may synchronize a counter of drive device 502-3 using a time synchronization process. For example, drive device 502-3 may synchronize the counter of drive device 502-3 with the counter of drive device 502-2 using the time synchronization process based on data (e.g., timestamp data) included in the serial data signal received by drive device 502-3.

In some non-limiting embodiments, drive device 502-3 may synchronize a time base of drive device 502-3 and a time base of drive device 502-2 by changing a count value on a counter of drive device 502-3 to correspond to a count value on a counter of drive device 502-2. As further shown by reference number 590 in FIG. 5, drive device 502-3 may execute a control event based on a predetermined time interval. In this way, when the count value is changed on the counter of drive device 502-3 between a first control event and a second control event (e.g., consecutive control events), the time interval between a first control event and a second control event (e.g., consecutive control events) may be greater than or less than a predetermined time interval between control events in the motion control system by a period 3 T.

In some non-limiting embodiments, the period 3 T may be based on the period of the time base (e.g., the local transceiver clock) of drive device 502-3. For example, the period 3 T may be within a range of 6 nanoseconds to 120 nanoseconds. In one example, the period 3 T is equal to 24 nanoseconds.

Figure 6:
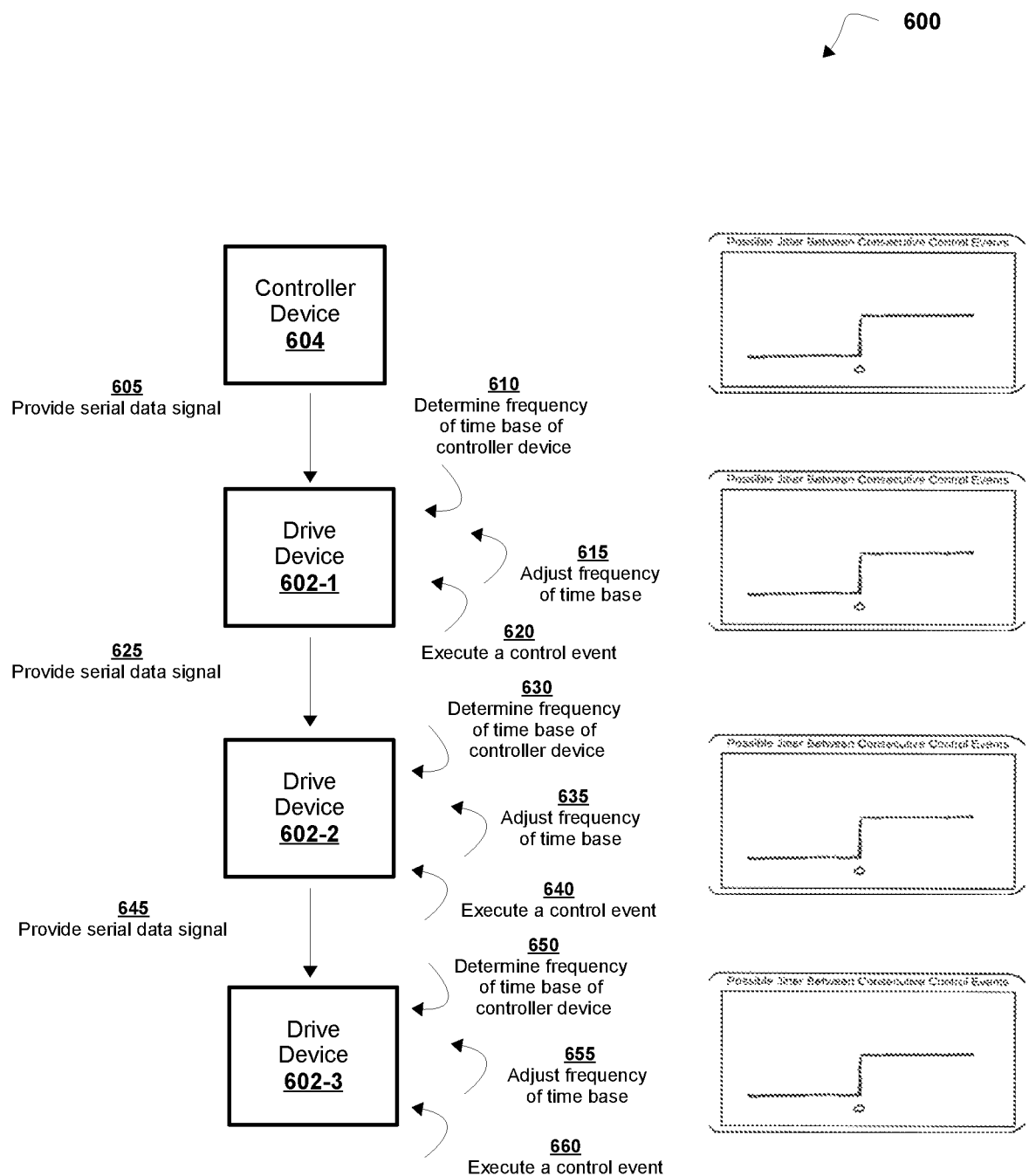
FIG. 6 is a diagram of an implementation of a non-limiting embodiment of a process disclosed herein.

FIG. 6 is a diagram of an overview of a non-limiting embodiment of an implementation 600 relating to process 400 shown in FIG. 4. As shown in FIG. 6, implementation 600 may include controller device 604, drive device 602-1, drive device 602-2, and drive device 602-3. In some non-limiting embodiments, controller device 604 may be the same or similar to controller device 104. In some non-limiting embodiments, drive device 602-1, drive device 602-2, and/or drive device 602-3 may be the same or similar to drive device 102.

As shown by reference number 605 in FIG. 6, controller device 604 may provide a serial data signal to drive device 602-1. In some non-limiting embodiments, controller device 604 may provide the serial data signal to drive device 602-1 based on a frequency of a time base (e.g., a local transceiver time base) of controller device 604. In some non-limiting embodiments, drive device 602-1 may receive the serial data signal and process data associated with the serial data signal to determine data associated with the frequency of the time base of controller device 604.

In some non-limiting embodiments, drive devices 602-1, 602-2, and 602-3 may synchronize a counter of drive devices 602-1, 602-2, and 602-3 using a time synchronization process. For example, drive device 602-1 may synchronize the counter of drive device 602-1 with the counter of controller device 604 using the time synchronization process based on data (e.g., timestamp data) included in the serial data signal received by drive device 602-1 from controller device 604. In such an example, drive device 602-2 may synchronize the counter of drive device 602-2 with the counter of drive device 602-1 using the time synchronization process based on data (e.g., timestamp data) included in the serial data signal received by drive device 602-2 from drive device 602-1. In that example, drive device 602-3 may synchronize the counter of drive device 602-3 with the counter of drive device 602-2 using the time synchronization process based on data (e.g., timestamp data) included in the serial data signal received by drive device 602-3 from drive device 602-2.

As further shown by reference number 610 in FIG. 6, drive device 602-1 may determine frequency of time base of controller device based on the data associated with the frequency of the time base of the controller device received by drive device 602-1. In some non-limiting embodiments, drive device 602-1 may determine the frequency of the time base of controller device 604 based on the data associated with the frequency of the time base of controller device 604.

As further shown by reference number 615 in FIG. 6, drive device 602-1 may adjust frequency of time base of drive device 602-1. For example, drive device 602-1 may adjust the frequency of the time base of drive device 602-1 based on the frequency adjustment determined by drive device 602-1. In this way, the count value of the counter of drive device 602-1 remains synchronized with the count value of the counter of controller device 604 as long as drive device 602-1 adjusts the frequency of the time base (e.g., the local time base) of drive device 602-1 so that the time base of drive device 602-1 is equal to the frequency of the time base (e.g., the local time base) of controller device 604.

As further shown by reference number 620 in FIG. 6, drive device 602-1 may execute a control event based on a predetermined time interval. In this way, a time interval between a first control event and a second control event (e.g., consecutive control events) may be equal to a predetermined time interval between control events in the motion control system.

As shown by reference number 625 in FIG. 6, drive device 602-1 may provide a serial data signal to drive device 602-2. In some non-limiting embodiments, drive device 602-1 may provide the serial data signal to drive device 602-2 based on a frequency of a time base (e.g., a local transceiver time base) of drive device 602-1. In some non-limiting embodiments, drive device 602-2 may receive the serial data signal and process data associated with the serial data signal to determine data associated with the frequency of the time base of controller device 604.

As further shown by reference number 630 in FIG. 6, drive device 602-2 may determine the frequency of the time base of controller device 604 based on the data associated with the frequency of the time base of controller device 604 determined by drive device 602-2. In some non-limiting embodiments, drive device 602-2 may determine the frequency of the time base of controller device 604 based on a serial data signal received from drive device 602-1.

As further shown by reference number 635 in FIG. 6, drive device 602-2 may adjust the frequency of the time base of drive device 602-2. For example, drive device 602-2 may adjust the frequency of the time base of drive device 602-2 based on the frequency adjustment determined by drive device 602-2. In this way, the count value of the counter of drive device 602-2 remains synchronized with the count value of the counter of controller device 604 and drive device 602-1 as long as drive device 602-2 adjusts the frequency of the time base (e.g., the local time base) of drive device 602-2 so that the time base of drive device 602-2 is equal to the frequency of the time base (e.g., the local time base) of controller device 604 and drive device 602-1.

As further shown by reference number 640 in FIG. 6, drive device 602-2 may execute a control event based on a predetermined time interval. In this way, a time interval between a first control event and a second control event (e.g., consecutive control events) may be equal to a predetermined time interval between control events in the motion control system.

As shown by reference number 645 in FIG. 6, drive device 602-2 may provide a serial data signal to drive device 602-3. In some non-limiting embodiments, drive device 602-2 may provide the serial data signal to drive device 602-3 based on a frequency of a time base (e.g., a local transceiver time base) of drive device 602-2. In some non-limiting embodiments, drive device 602-3 may receive the serial data signal and process data associated with the serial data signal to determine data associated with the frequency of the time base of controller device 604.

As further shown by reference number 650 in FIG. 6, drive device 602-3 may determine frequency of time base of controller device 604 based on the data associated with the frequency of the time base of controller device 604 determined by drive device 602-3. In some non-limiting embodiments, drive device 602-3 may determine the frequency of the time base of controller device 604 based on a serial data signal received from drive device 602-2.

As further shown by reference number 655 in FIG. 6, drive device 602-3 may adjust the frequency of the time base of drive device 602-3. For example, drive device 602-3 may adjust the frequency of time base of drive device 602-3 based on the frequency adjustment determined by drive device 602-3. In this way, the count value of the counter of drive device 602-3 remains synchronized with the count value of the counter of controller device 604, drive device 602-1, and drive device 602-2 as long as drive device 602-3 adjusts the frequency of the time base (e.g., the local time base) of drive device 602-3 so that the time base of drive device 602-3 is equal to the frequency of the time base (e.g., the local time base) of controller device 604, drive device 602-1, and drive device 602-2.

As further shown by reference number 660 in FIG. 6, drive device 602-3 may execute a control event based on a predetermined time interval. In this way, a time interval between a first control event and a second control event (e.g., consecutive control events) may be equal to a predetermined time interval between control events in the motion control system.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more" and/or "at least one". Furthermore, as used herein, the term "set" is intended to include one or more items (e.g., related items, unrelated items, a combination of related and unrelated items, etc.), and may be used interchangeably with "one or more" and/or "at least one." Where only one item is intended, the term "one" or similar language is used. Also, as used herein, the terms "has," "have," "having," or the like are intended to be open-ended terms. Further, the phrase "based on" is intended to mean "based, at least in part, on", "in response to", or the like, unless explicitly stated otherwise.

What is claimed is:

1. A system, comprising:
    at least one drive device:
    receive a data signal associated with a time base of a controller device in a motion control system;
    determine a frequency of the time base of the controller device based on the data signal associated with the time base of the controller device;
    determine a frequency adjustment to be made to a time base of the at least one drive device based on the frequency of the time base of the controller device;
    adjust a frequency of the time base of the at least one drive device based on the frequency adjustment; and
    provide a data signal associated with the time base of the at least one drive device.

2. The system of claim 1, wherein, when receiving the data signal associated with the time base of the controller device in the motion control system, the at least one drive device is to:
    receive serial data associated with the time base of the controller device in the motion control system via a serial communication bus.

3. The system of claim 1, wherein, when determining the frequency adjustment to be made to the time base of the at least one drive device, the at least one drive device is to:
    determine the frequency adjustment to be made to the time base of the at least one drive device based on the frequency of the time base of the controller device independent of data associated with a time synchronization process of the motion control system.

4. The system of claim 3, wherein, when determining the frequency adjustment to be made to the time base of the at least one drive device based on the frequency of the time base of the controller device independent of the data associated with the time synchronization process, the at least one drive device is to:

determine the frequency adjustment to be made to the time base of the at least one drive device based on the frequency of the time base of the controller device independent of timestamp data associated with a timestamp for the time synchronization process of the motion control system.

5. The system of claim 1, wherein, when adjusting the frequency of the time base of the at least one drive device based on the frequency adjustment, the at least one drive device is to:

adjust the frequency of the time base of the at least one drive device to correspond to the frequency of the time base of the controller device based on the frequency adjustment.

6. The system of claim 1, wherein the at least one drive device is a first drive device and wherein, when providing the data signal associated with the time base of the first drive device, the first drive device is to:

provide the data signal associated with the time base of the first drive device to a second drive device that is downstream of the first drive device with regard to a serial communication link.

7. The system of claim 1, wherein the at least one drive device is further to:

execute a control event based on the frequency of the time base of the at least one drive device.

8. A method, comprising:

receiving, with at least one drive device, a data signal associated with a time base of a controller device in a motion control system;

determining, with the at least one drive device, a frequency of the time base of the controller device based on the data signal associated with the time base of the controller device;

determining, with the at least one drive device, a frequency adjustment to be made to a time base of the at least one drive device based on the frequency of the time base of the controller device;

adjusting, with the at least one drive device, a frequency of the time base of the at least one drive device based on the frequency adjustment; and providing, with the at least one drive device, a data signal associated with the time base of the at least one drive device.

9. The method of claim 8, wherein receiving the data signal associated with the time base of the controller device in the motion control system comprises:

receiving serial data associated with the time base of the controller device in the motion control system via a serial communication bus.

10. The method of claim 8, wherein determining the frequency adjustment to be made to the time base of the at least one drive device comprises:

determining the frequency adjustment to be made to the time base of the at least one drive device based on the frequency of the time base of the controller device independent of data associated with a time synchronization process of the motion control system.

11. The method of claim 10, wherein determining the frequency adjustment to be made to the time base of the at least one drive device based on the frequency of the time base of the controller device independent of the data associated with the time synchronization process comprises:

determining the frequency adjustment to be made to the time base of the at least one drive device based on the frequency of the time base of the controller device independent of timestamp data associated with a timestamp for the time synchronization process of the motion control system.

12. The method of claim 8, wherein adjusting the frequency of the time base of the at least one drive device based on the frequency adjustment comprises:

adjusting the frequency of the time base of the at least one drive device to correspond to the frequency of the time base of the controller device based on the frequency adjustment.

13. The method of claim 8, wherein the at least one drive device is a first drive device and wherein providing the data signal associated with the time base of the first drive device comprises:

providing the data signal associated with the time base of the first drive device to a second drive device that is downstream of the first drive device with regard to a serial data communication link.

14. The method of claim 8, further comprising:

executing a control event based on the frequency of the time base of the at least one drive device.

15. A computer program product, the computer program product comprising at least one non-transitory computer-readable medium including one or more instructions that, when executed by at least one drive device, cause the at least one drive device to:

receive a data signal associated with a time base of a controller device in a motion control system;

determine a frequency of the time base of the controller device based on the data signal associated with the time base of the controller device;

determine a frequency adjustment to be made to a time base of the at least one drive device based on the frequency of the time base of the controller device;

adjust a frequency of the time base of the at least one drive device based on the frequency adjustment; and provide a data signal associated with the time base of the at least one drive device.

16. The computer program product of claim 15, wherein the one or more instructions that cause the at least one drive device to receive the data signal associated with the time base of the controller device in the motion control system, cause the at least one drive device to:

receive serial data associated with the time base of the controller device in the motion control system via a serial communication bus.

17. The computer program product of claim 15, wherein the one or more instructions that cause the at least one drive device to determine the frequency adjustment to be made to the time base of the at least one drive device, cause the at least one drive device is to:

determine the frequency adjustment to be made to the time base of the at least one drive device based on the frequency of the time base of the controller device independent of data associated with a time synchronization process of the motion control system.

18. The computer program product of claim 17, wherein the one or more instructions that cause the at least one drive device to determine the frequency adjustment to be made to the time base of the at least one drive device based on the frequency of the time base of the controller device independent of the data associated with the time synchronization process, cause the at least one drive device to:

determine the frequency adjustment to be made to the time base of the at least one drive device based on the frequency of the time base of the controller device independent of timestamp data associated with a timestamp for the time synchronization process of the motion control system.

19. The computer program product of claim 15, wherein the one or more instructions that cause the at least one drive device to adjust the frequency of the time base of the at least one drive device based on the frequency adjustment, cause the at least one drive device to:

adjust the frequency of the time base of the at least one drive device to correspond to the frequency of the time base of the controller device based on the frequency adjustment.

20. The computer program product of claim 15, wherein the one or more instructions further cause the at least one drive device to:

execute a control event based on the frequency of the time base of the at least one drive device.

* * * * *

UNITED STATES PATENT AND TRADEMARK OFFICE
CERTIFICATE OF CORRECTION

PATENT NO.        : 10,848,160 B2
APPLICATION NO.   : 16/031337
DATED             : November 24, 2020
INVENTOR(S)       : David Wayne Sammel, Jr.

Page 1 of 1

It is certified that error appears in the above-identified patent and that said Letters Patent is hereby corrected as shown below:

In the Claims

Column 20, Line 37, Claim 1, delete "device:" and insert -- device to: --

Column 22, Line 55, Claim 1, after "device" delete "is"

Signed and Sealed this
First Day of June, 2021

Drew Hirshfeld
*Performing the Functions and Duties of the*
*Under Secretary of Commerce for Intellectual Property and*
*Director of the United States Patent and Trademark Office*